US009653589B2

(12) United States Patent
Umeno et al.

(10) Patent No.: US 9,653,589 B2
(45) Date of Patent: May 16, 2017

(54) SEMICONDUCTOR MULTI-LAYER SUBSTRATE, SEMICONDUCTOR DEVICE, AND METHOD FOR MANUFACTURING THE SAME

(71) Applicants: Furukawa Electric Co., Ltd., Tokyo (JP); Fuji Electric Co., Ltd., Kawasaki-shi (JP)

(72) Inventors: Kazuyuki Umeno, Tokyo (JP); Tatsuyuki Shinagawa, Tokyo (JP); Keishi Takaki, Tokyo (JP); Ryosuke Tamura, Tokyo (JP); Shinya Ootomo, Tokyo (JP)

(73) Assignees: FURUKAWA ELECTRIC CO., LTD., Tokyo (JP); FUJI ELECTRIC CO., LTD., Kawasaki-shi (JP)

( * ) Notice: Subject to any disclaimer, the term of this patent is extended or adjusted under 35 U.S.C. 154(b) by 0 days.

(21) Appl. No.: 14/482,636

(22) Filed: Sep. 10, 2014

(65) Prior Publication Data
US 2014/0374771 A1 Dec. 25, 2014

Related U.S. Application Data

(63) Continuation of application No. PCT/JP2013/057698, filed on Mar. 18, 2013.

(30) Foreign Application Priority Data

Mar. 16, 2012 (JP) ................................ 2012-061213

(51) Int. Cl.
*H01L 29/778* (2006.01)
*H01L 21/02* (2006.01)
(Continued)

(52) U.S. Cl.
CPC ...... *H01L 29/7787* (2013.01); *H01L 21/0254* (2013.01); *H01L 21/0262* (2013.01);
(Continued)

(58) Field of Classification Search
CPC ............... H01L 22/12; H01L 22/02458; H01L 22/0254; H01L 2924/3511; H01L 29/2003
See application file for complete search history.

(56) References Cited

U.S. PATENT DOCUMENTS 5,331,193 A * 7/1994 Mukogawa ......... H01L 27/0623
257/350
8,247,842 B2 8/2012 Sato
(Continued)

FOREIGN PATENT DOCUMENTS

JP 2009-188252 A 8/2009
JP 2009-289956 A1 12/2009
(Continued)

OTHER PUBLICATIONS

International Search Report mailed May 14, 2013 for PCT/JP2013/057698 Filed Mar. 18, 2013 with English Translation.
(Continued)

*Primary Examiner* — Jerome Jackson, Jr.
*Assistant Examiner* — David Spalla
(74) *Attorney, Agent, or Firm* — Oblon, McClelland, Maier & Neustadt, L.L.P.

(57) ABSTRACT

A semiconductor multi-layer substrate includes a substrate made of Si and a multi-layer semiconductor layer. The multi-layer semiconductor layer includes an active layer made of a nitride semiconductor, a first warp control layer being formed between the substrate and the active layer and giving a predetermined warp to the substrate, and a second warp control layer made of a nitride semiconductor of which amount of an increase in a warp per a unit thickness is (Continued)

smaller than an amount of increase in the warp per a unit thickness of the first warp control layer. A total thickness of the multi-layer semiconductor layer is equal to or larger than 4 µm.

38 Claims, 12 Drawing Sheets

(51) Int. Cl.
    H01L 21/66     (2006.01)
    H01L 29/20     (2006.01)
    H01L 29/201    (2006.01)
    H01L 29/205    (2006.01)
    H01L 29/66     (2006.01)
    H01L 29/861    (2006.01)
    H01L 29/15     (2006.01)

(52) U.S. Cl.
    CPC ........ *H01L 21/02458* (2013.01); *H01L 22/12* (2013.01); *H01L 29/155* (2013.01); *H01L 29/201* (2013.01); *H01L 29/2003* (2013.01); *H01L 29/205* (2013.01); *H01L 29/66431* (2013.01); *H01L 29/861* (2013.01)

(56) References Cited

U.S. PATENT DOCUMENTS

| | | | |
|---|---|---|---|
| 8,344,356 B2 | 1/2013 | Sakamoto et al. | |
| 2011/0272665 A1* | 11/2011 | Yamaguchi | H01L 21/02381 257/12 |
| 2012/0223328 A1* | 9/2012 | Ikuta | H01L 21/02381 257/76 |

FOREIGN PATENT DOCUMENTS

| | | |
|---|---|---|
| JP | 2010-232293 A | 10/2010 |
| JP | 2011-23642 A | 2/2011 |
| JP | 2011-100772 A | 5/2011 |
| JP | 2011-119715 A1 | 6/2011 |
| JP | 2011-187654 A | 9/2011 |
| JP | 2011-238685 A | 11/2011 |
| JP | 2012-243870 A | 12/2012 |
| WO | WO 2009/084431 A1 | 7/2009 |
| WO | WO 2011/102044 A1 | 8/2011 |

OTHER PUBLICATIONS

Office Action issued Jan. 24, 2017 in Japanese Patent Application No. 2014-505046 (with machine English translation).

\* cited by examiner

SEMICONDUCTOR MULTI-LAYER SUBSTRATE, SEMICONDUCTOR DEVICE, AND METHOD FOR MANUFACTURING THE SAME

CROSS-REFERENCE TO RELATED APPLICATION

This application is a continuation of PCT International Application No. PCT/JP2013/057698 filed on Mar. 18, 2013 which claims the benefit of priority from Japanese Patent Application No. 2012-061213 filed on Mar. 16, 2012, the entire contents of which are incorporated herein by reference.

BACKGROUND OF THE INVENTION

1. Field of the Invention

The present application relates to a semiconductor multi-layer substrate, a semiconductor device, and a method for manufacturing the same.

2. Description of the Related Art

Conventionally, a configuration of a semiconductor device, of which withstand voltage is high and warp is small, is disclosed (see Japanese Laid-open Patent Publication No. 2009-289956 and Japanese Laid-open Patent Publication No. 2011-119715).

SUMMARY OF THE INVENTION

It is an object of the present invention to at least partially solve the problems in the conventional technology.

In accordance with one aspect of the present invention, a semiconductor multi-layer substrate includes a substrate made of Si and a multi-layer semiconductor layer. The multi-layer semiconductor layer includes an active layer made of a nitride semiconductor, a first warp control layer being formed between the substrate and the active layer and giving a predetermined warp to the substrate, and a second warp control layer made of a nitride semiconductor of which amount of an increase in a warp per a unit thickness is smaller than an amount of increase in the warp per a unit thickness of the first warp control layer. A total thickness of the multi-layer semiconductor layer is equal to or larger than 4 µm.

In accordance with another aspect of the present invention, a semiconductor multi-layer substrate includes a substrate made of Si and a multi-layer semiconductor layer. The multi-layer semiconductor layer includes a first warp control layer being made of a nitride semiconductor grown on the substrate and imparting a predetermined warp to the substrate, a second warp control layer made of a nitride semiconductor, grown on the first warp control layer, of which amount of an increase in a warp per a unit thickness is smaller than an amount of increase the warp per a unit thickness of the first warp control layer, and an active layer made of a nitride semiconductor grown on the second warp control layer. A total thickness of the multi-layer semiconductor layer is equal to or larger than 4 µm.

In accordance with still another aspect of the present invention, a semiconductor device includes a semiconductor multi-layer substrate. The semiconductor multi-layer substrate includes a substrate made of Si and a multi-layer semiconductor layer. The multi-layer semiconductor layer includes an active layer made of a nitride semiconductor, a first warp control layer being formed between the substrate and the active layer and giving a predetermined warp to the substrate, and a second warp control layer made of a nitride semiconductor of which amount of an increase in a warp per a unit thickness is smaller than an amount of increase in the warp per a unit thickness of the first warp control layer. A total thickness of the multi-layer semiconductor layer is equal to or larger than 4 µm.

In accordance with still another aspect of the present invention, a semiconductor device includes a semiconductor multi-layer substrate. The semiconductor multi-layer substrate includes a substrate made of Si and a multi-layer semiconductor layer. The multi-layer semiconductor layer includes a first warp control layer being made of a nitride semiconductor grown on the substrate and imparting a predetermined warp to the substrate, a second warp control layer made of a nitride semiconductor, grown on the first warp control layer, of which amount of an increase in a warp per a unit thickness is smaller than an amount of increase the warp per a unit thickness of the first warp control layer, and an active layer made of a nitride semiconductor grown on the second warp control layer. A total thickness of the multi-layer semiconductor layer is equal to or larger than 4 µm.

In accordance with still another aspect of the present invention, a method of manufacturing a semiconductor multi-layer substrate includes growing a first warp control layer made of a nitride semiconductor on a substrate made of Si, the first warp control layer giving a predetermined warp to the substrate, growing a second warp control layer on the first warp control layer, the second warp control layer being made of a nitride semiconductor of which amount of increase in a warp per a unit thickness is smaller than an amount of increase in the warp per a unit thickness of the first warp control layer, and growing an active layer made of a nitride semiconductor on the second warp control layer.

In accordance with still another aspect of the present invention, a method of manufacturing a semiconductor device by using a semiconductor multi-layer substrate manufactured by a method of manufacturing a semiconductor multi-layer substrate which includes growing a first warp control layer made of a nitride semiconductor on a substrate made of Si, the first warp control layer giving a predetermined warp to the substrate, growing a second warp control layer on the first warp control layer, the second warp control layer being made of a nitride semiconductor of which amount of increase in a warp per a unit thickness is smaller than an amount of increase in the warp per a unit thickness of the first warp control layer, and growing an active layer made of a nitride semiconductor on the second warp control layer.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Figure 1:
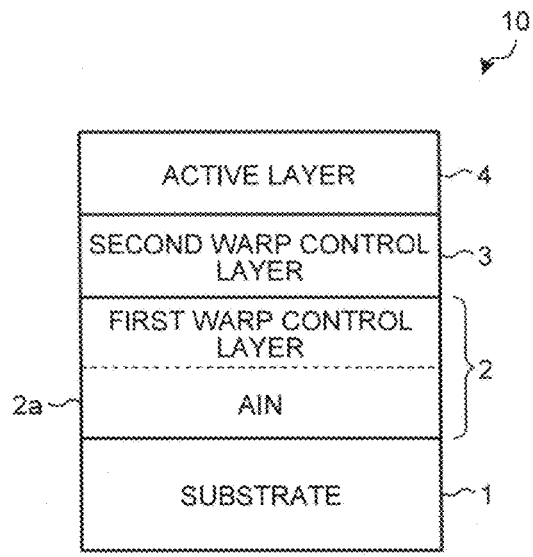
FIG. 1 is a schematic view of a semiconductor multi-layer substrate according to an embodiment 1.

Hereinafter, embodiments of a semiconductor multi-layer substrate, a semiconductor device, and a method for manufacturing the same according to the present invention will be described in detail with reference to the drawings. The embodiments do not limit the present invention. Also, in each drawing, if deemed appropriate, identical or equivalent devices are given same reference numerals. In addition, it should be noted that the drawings are schematic depictions, and do not represent the actual relation of dimension of each device. Furthermore, different drawings may include portions using different scales and dimensional relations.

For restraining a current collapse of the structure of the semiconductor device disclosed by Japanese Laid-open Patent Publication No. 2009-289956, it is desirable that an active layer (for example, made of GaN) is grown with a larger thickness for reducing an electric field applied to the active layer. However, in a case where the active layer was grown with a larger thickness (for example, equal to or larger than 4 μm) for increasing the withstand voltage in a state where the entire thickness of the active layer increased, there was a problem that a crack density increased in a semiconductor multi-layer substrate and this caused an increase in a leakage current in the semiconductor device. In the structure disclosed by Japanese Laid-open Patent Publication No. 2011-119715, there was a problem that it was difficult to control adjustment of a warp arbitrarily without increasing the crack density in a state where the entire thickness of the active layer increased (for example, equal to or larger than 4 μm) and production was time-consuming, thus production cost increased.

In contrast, the present embodiment obtains an effect that a current leakage and a current collapse can be restrained without increasing a crack density, and also an effect that a production cost can be reduced is obtained.

FIG. 1 is a schematic view of a semiconductor multi-layer substrate according to an embodiment 1. A semiconductor multi-layer substrate 10 includes a substrate 1, a first warp control layer 2, a second warp control layer 3, and an active layer 4. The first warp control layer 2, the second warp control layer 3, and the active layer 4 are grown on the substrate 1 in this order by metal organic chemical vapor deposition method. The first warp control layer 2 has, at its lowermost layer which is an interface with the substrate 1, an AlN layer 2a.

The first warp control layer 2 is of a structure that an increase in amount of warp per a unit thickness is large in degree. The second warp control layer 3 is of a structure that an increase in amount of warp per a unit thickness is smaller in degree than that of the first warp control layer 2. It is hereby possible to adjust the warp during the growth and restrain a crack from being produced when layering the active layer 4 on the second warp control layer 3. Since the active layer 4 can be large in thickness, it is possible to restrain a current collapse by reducing an electric field applied to the active layer 4.

Figure 2:
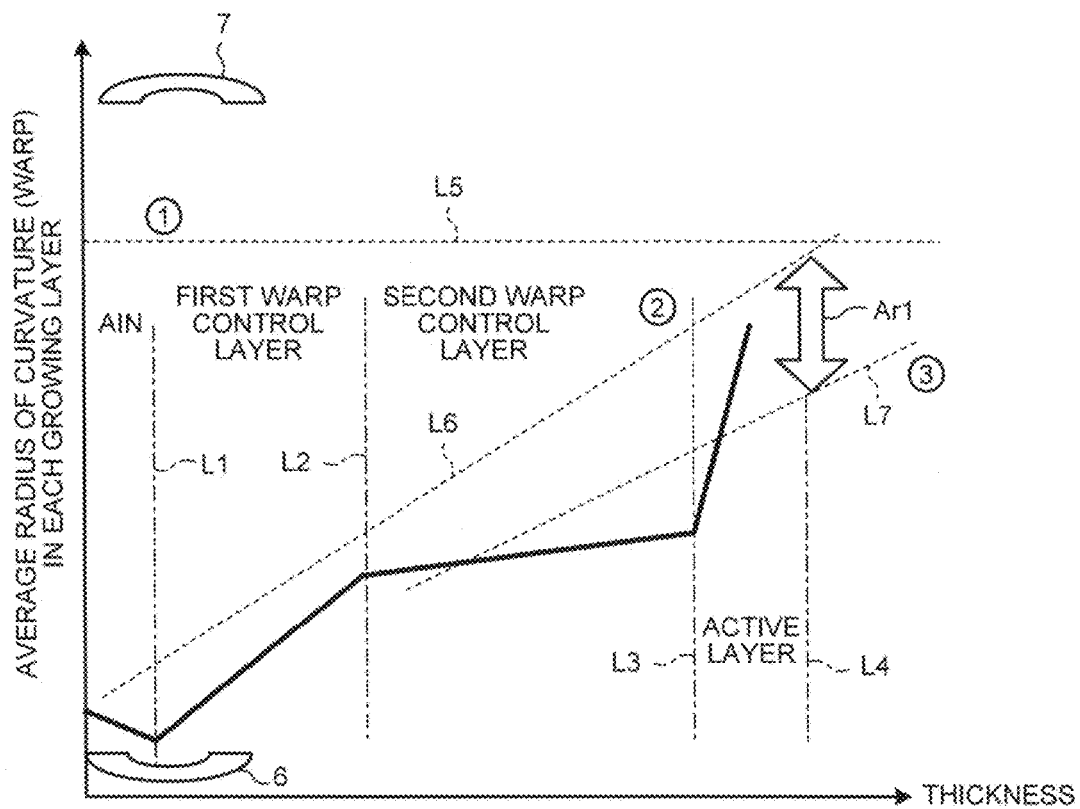
FIG. 2 is a drawing illustrating a relationship between a growth time and a warp of the semiconductor multi-layer substrate.
Figure 6:
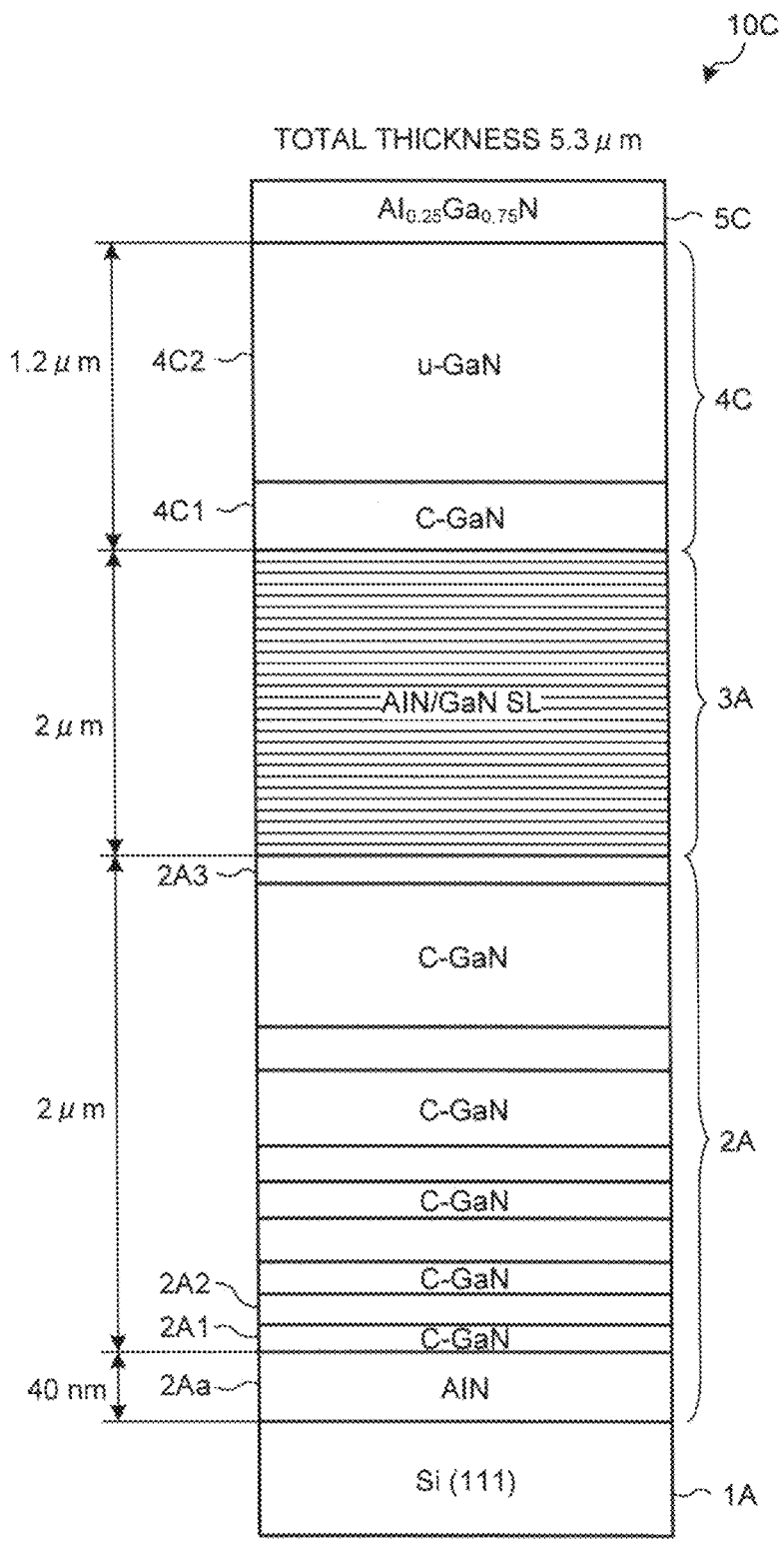
FIG. 6 is a schematic view of a semiconductor multi-layer substrate according to an example.

FIG. 2 is a drawing showing a relationship between a growth time and a warp of a semiconductor multi-layer substrate. When growing a growth layer (first warp control layer 2 to active layer 4), a temperature of the substrate is increased from a room temperature to a growth temperature. A temperature of the substrate is decreased to the room temperature after finishing the growth. The growth time is in proportion to a thickness of each layer (but a proportional coefficient differs based on a composition of each layer). A vertical axis indicates an average radius of curvature in each layer during growth which can be measured by a laser reflection device. In FIG. 2, FIGS. 6 and 7 indicate directions of warps. The FIG. 6 indicates that the layered substrate when growing in upward direction warps in a convex shape and the FIG. 7 indicates that the layered substrate when growing in upward direction warps in a concave shape.

A line L1 indicates an interface between the AlN layer 2a and other portion in the first warp control layer 2. A line L2 indicates an interface between the first warp control layer 2 and the second warp control layer 3. A line L3 indicates an interface between the second warp control layer 3 and the active layer 4. A line L4 indicates a surface of the active layer 4. A line L5 (circled number 1) indicates a warp that is an impermissible stress limit which, if a thickness of a layered substrate exceeds it, may cause a plastic deformation and a fracture and the like of the layered substrate. A line L6 (circled number 2) indicates a warp that is an impermissible stress limit which, if a thickness of a layered substrate exceeds it, may cause a crack to be produced in a growth layer (first warp control layer 2 to active layer 4). A line L7 (circled number 3) indicates a warp which causes a minimum limit of stress to be exceeded for preventing a crack from being produced by a thermal strain between a growth temperature and a room temperature.

Since, when finishing growth, a warp (radius of curvature) can be maintained between the line L6 and the line L7 (a range indicated by an arrow Ar1) in the present embodiment 1, it is possible to restrain a current collapse by increasing the thickness of the active layer 4 while restraining a crack from being produced. In particular, it is possible to prevent a crack from being produced in an area not including a 10 mm width of area of an outer periphery of a semiconductor multi-layer substrate having a diameter of four inches (approximately 100 mm). Similarly to the four-inch diameter of semiconductor multi-layer substrate, it is possible to obtain a similar effect in a semiconductor multi-layer substrate having a diameter of four to twelve inches such as, for example, a semiconductor multi-layer substrate having six-inch (approximately 150 mm) diameter.

Figure 3A:
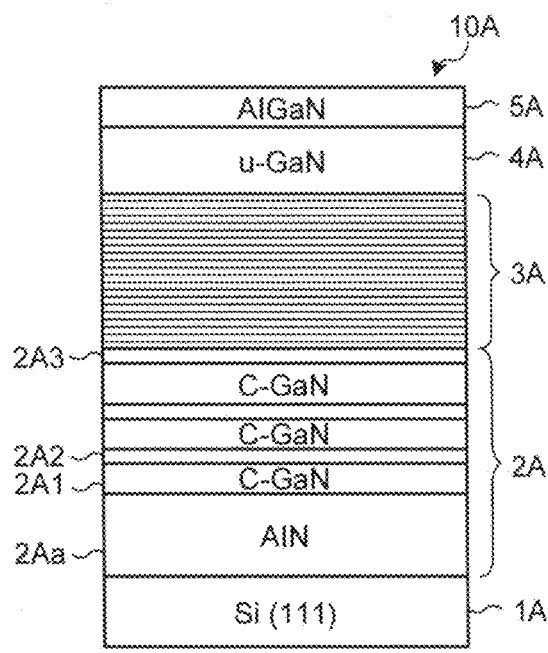
FIG. 3A is a schematic view of a semiconductor multi-layer substrate according to an embodiment 2.

FIG. 3A is a schematic view of a semiconductor multi-layer substrate according to an embodiment 2. A semiconductor multi-layer substrate 10A includes a substrate 1A. The semiconductor multi-layer substrate 10A includes a first warp control layer 2A, a second warp control layer 3A, an active layer 4A and a semiconductor layer 5A grown in this order on the substrate 1A.

The substrate 1A is an Si (111) substrate having a thickness of 525 µm to 1200 µm and may be inclined slightly within a range of ±10°.

Figure 3B:
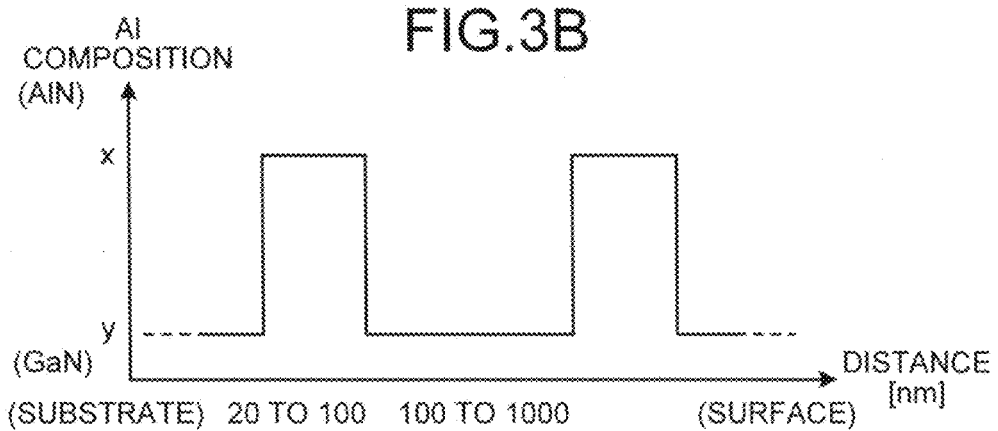
FIG. 3B is a drawing illustrating a layered structure of a first warp control layer.
Figure 3C:
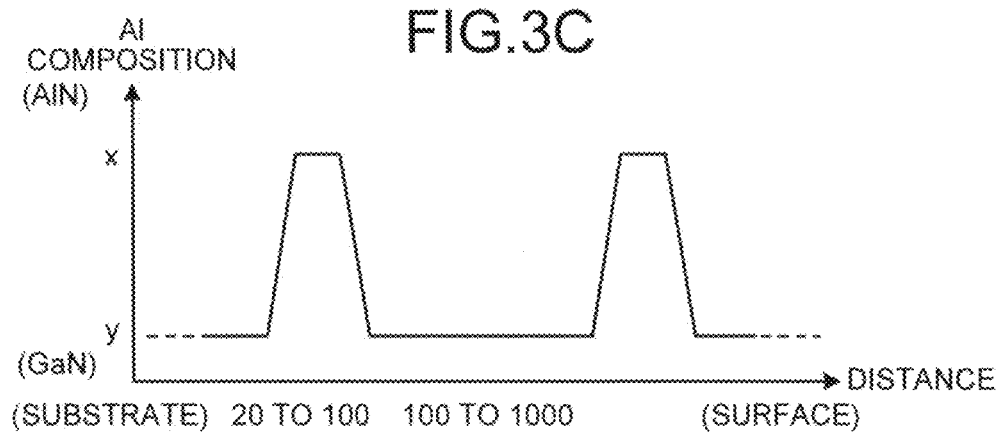
FIG. 3C is a drawing illustrating another example of the layered structure of the first warp control layer.

The first warp control layer 2A is of a structure in which a C—GaN layer 2A1 and an AlN layer 2A2 are layered repeatedly a plurality of times on an AlN layer 2Aa having a thickness of 20 nm to 200 nm. As illustrated in FIG. 3B, the C—GaN layer 2A1 is of a thickness of 100 nm to 1000 nm to a degree that a quantum size effect is not produced and is made of GaN which is doped with carbon. The AlN layer 2A2 is of a thickness of 20 nm to 100 nm to a degree that a quantum size effect is not produced. It is preferable that the concentration of carbon doping with AlN is lower than that of GaN. For increasing the amount of warp in the first warp control layer, it is preferable that a thickness of the C—GaN layer 2A1 is equal to or larger than 100 nm. For restraining a crack from being produced in C—GaN, it is preferable that the thickness of the C—GaN layer 21A is equal to or smaller than 1000 nm. Although Al and Ga may be contained in the C—GaN layer 2A1 and the AlN layer 2A2 respectively, an effect that is capable of increasing the warp to the greatest degree is obtained in a case where Al and Ga are not contained in the C—GaN layer 2A1 and the AlN layer 2A2 respectively. Since a surface-roughened AlN layer 2A3 exists at an uppermost layer of the first warp control layer 2A, and thus a dislocation of the first warp control layer 2A is terminated, it is hereby possible to reduce a dislocation density in layers thereabove. An AlGaN layer having equal to or larger than 80% of Al composition and being surface-roughened, or a multi AlGaN layer having an Al composition being reduced stepwise toward a surface direction may be provided in place of the AlN layer 2A3. Herein in the multi AlGaN layer, it is possible to reduce the dislocation density effectively if the multi AlGaN layer is provided with at least a lower AlGaN layer, at an area of the most substrate side, having equal to or larger than 80% of Al composition and an upper AlGaN layer, at an area of the most surface side, having an Al composition equal to or larger than that of a layer formed on the multi AlGaN layer. However, in a case where the layer formed on the multi AlGaN layer is of a layered structure of layers each having a thickness to a degree that a quantum size effect is obtained, the Al compositions are to be compared with an average Al composition of the layered structure. The multi AlGaN layer may further include at least an intermediate AlGaN layer, of which Al composition varies stepwise, between the lower AlGaN layer and the upper AlGaN layer. In addition, a surface-roughened AlGaN layer of which Al composition is equal to or larger than 80% and the above-described multi AlGaN layer may be formed between the AlN layer 2Aa contacting the substrate 1A and the C—GaN layer 2A1. In this structure, an unintended carrier (two-dimensional electron gas) is produced by a piezo polarization and a spontaneous polarization sometimes at an interface between the C—GaN layer 2A1 and the AlN layer 2A2 in the first warp control layer. Since a leakage current being caused by it and flowing in a direction toward the substrate 1A increases, a first AlGaN graded layer may be provided additionally at an interface between the C—GaN layer 2A1 and the AlN layer 2A2 formed thereon so that an Al composition in the first AlGaN graded layer increases from the C—GaN layer 2A1 to the AlN layer 2A2 stepwise or continuously, and a second AlGaN graded layer may be provided additionally at an interface between the AlN layer 2A2 and the C—GaN layer 2A1 formed thereon so that an Al composition of the second AlGaN graded layer decreases stepwise or continuously from the AlN layer 2A2 to the C—GaN layer 2A1.

Figure 3D:
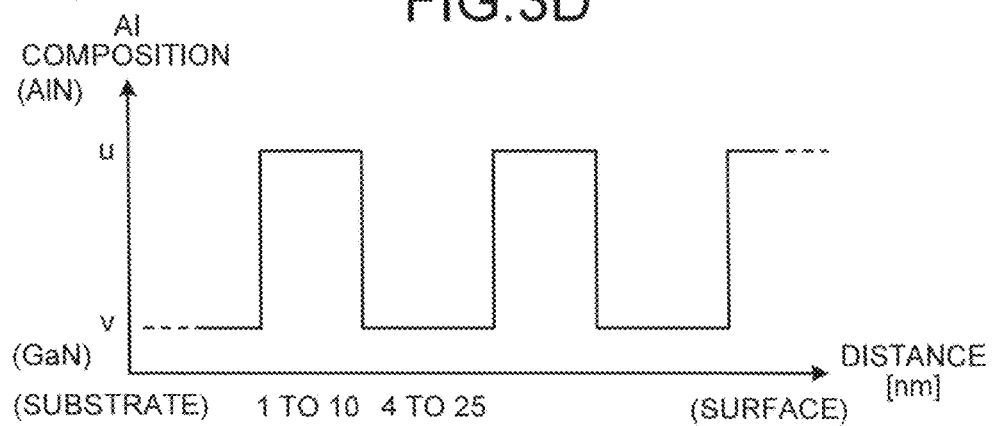
FIG. 3D is a drawing illustrating a layered structure of a second warp control layer.
Figure 3E:
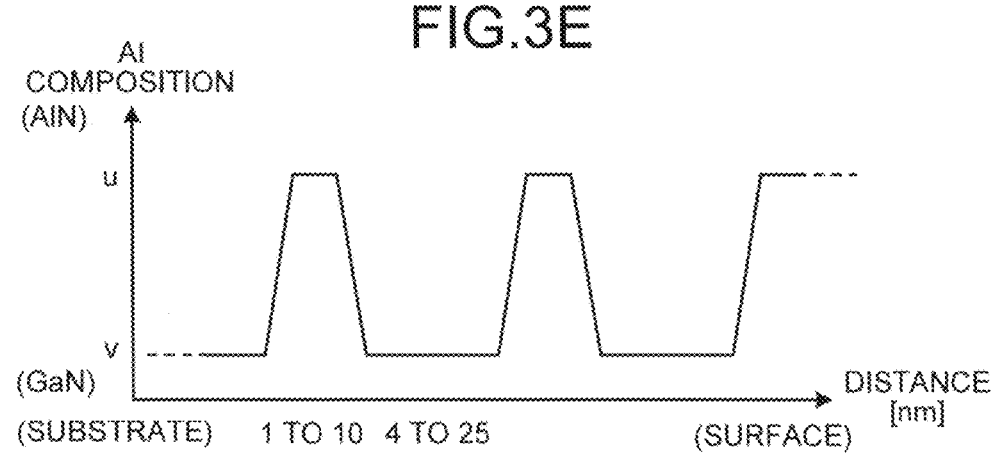
FIG. 3E is a drawing illustrating another example of the layered structure of the second warp control layer.
Figure 3F:
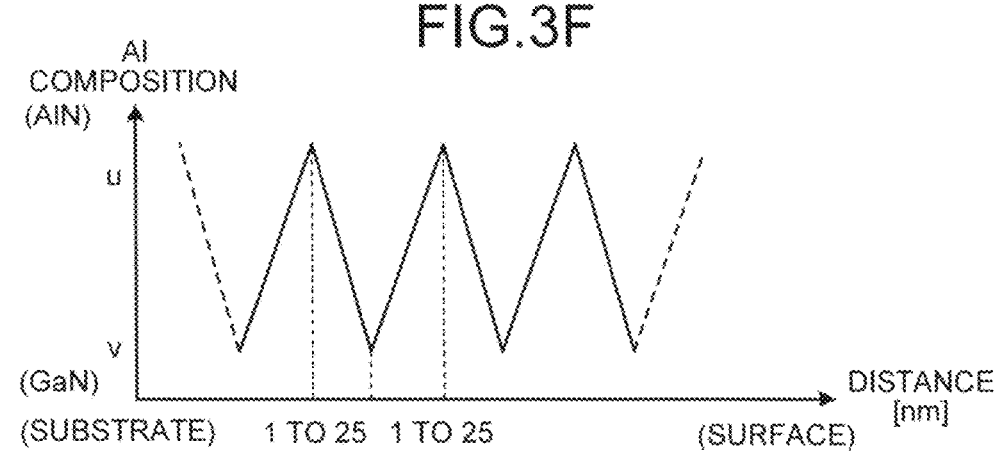
FIG. 3F is a drawing illustrating another example of the layered structure of the second warp control layer.

As shown in FIG. 3D, in this structure, the second warp control layer 3A has a superlattice structure in which an $Al_uGa_{1-u}N$ layer and an $Al_vGa_{1-v}N$ layer are layered repeatedly a plurality of times. The $Al_uGa_{1-u}N$ layer has a thin thickness of 1 nm to 10 nm and the $Al_vGa_{1-v}N$ layer has a thickness of 15 nm to 25 nm. Each of the thickness is to a degree that a quantum size effect is obtained for not producing an electric field barrier layer caused by an unintended carrier (two-dimensional electron gas) produced by a piezo polarization and a spontaneous polarization. For further restraining an unintended carrier from being produced and restraining a leakage current from flowing in a surface direction, as shown in FIG. 3E, a third AlGaN graded layer may be provided additionally between the $Al_vGa_{1-v}N$ layer and the $Al_uGa_{1-u}N$ layer so that an Al composition of the third AlGaN graded layer increases from v to u stepwise or continuously, and a fourth AlGaN graded layer may be provided additionally between the $Al_uGa_{1-u}N$ layer and the $Al_vGa_{1-v}N$ layer so that an Al composition of the fourth AlGaN graded layer decreases from u to v stepwise or continuously. Herein a continuous increase or a continuous decrease includes not only a case where a changing amount of the Al composition per a unit thickness is constant but also a case where a changing amount increases or decreases toward a surface side, or a case where a changing amount increases and decreases continuously and repeatedly. In a case where an AlGaN layer, of which average Al composition is equivalent to that of the superlattice structure, is layered simply, a lattice relaxation prevents a warp of the second warp control layer from increasing as shown in an area below the line L7 (circled number 3) in FIG. 2, and thus a crack is produced on an entire surface of the semiconductor multi-layer substrate at a room temperature after being grown. The second warp control layer 3A is not limited to the above-described structure and may be of a structure that a fifth AlGaN graded layer and a sixth AlGaN graded layer are layered repeatedly a plurality of times as shown in FIG. 3F. The fifth AlGaN graded layer is of a thickness of 1 nm to 25 nm and an Al composition of the fifth AlGaN graded layer increases stepwise or continuously from v to u. The sixth AlGaN graded layer is of a thickness of 1 nm to 25 nm and an Al composition of the sixth AlGaN graded layer decreases stepwise or continuously from u to v.

It is preferable that average carbon concentrations of the first warp control layer 2A and the second warp control layer 3A are equal to or larger than $0.5 \times 10^{19}$ cm$^{-3}$ for restraining leakage of a current flowing in a direction to the substrate 1A, and smaller than $5 \times 10^{19}$ cm$^{-3}$ is preferable for restraining a leakage of current from being produced by a defect caused by doping with carbon.

The active layer 4A is made of u-GaN of which carbon concentration is equal to or smaller than $1 \times 10^{17}$ cm$^{-3}$ at which a current collapse is not affected by carbon forming a deep level causing a current collapse. Although the active layer 4A may contain C—GaN containing equal to or larger than $0.5 \times 10^{19}$ cm$^{-3}$ of carbon concentration below the u-GaN layer for restraining a leakage current from flowing in a surface direction, it is preferable that the thickness of u-GaN layer is equal to or larger than 100 nm for restraining the current collapse. The C—GaN layer may be a C—AlGaN layer of which Al composition is equal to or smaller than 20%.

The semiconductor layer 5A is made of AlGaN having a band gap larger than a band gap of the active layer 4A. The semiconductor layer 5A is intended to cause the active layer 4A to produce a two-dimensional electron gas. Instead of the semiconductor layer 5A, a semiconductor or an insulating film having a band gap larger than a band gap of the active layer 4A may be provided.

The semiconductor multi-layer substrate 10A is provided with the second warp control layer 3A of which amount of warp increasing per a unit thickness is smaller than that of the first warp control layer 2A. As a result of that, it is possible to increase the thickness of the active layer 4A (for example, equal to or larger than 0.4 μm), thereby restraining a current collapse. Since a growth rate for the first warp control layer 2A can be faster than a growth rate for a buffer layer of a simple superlattice structure, it is advantageous for reducing a production cost. A leakage current in a substrate direction can also be reduced.

Figure 4:
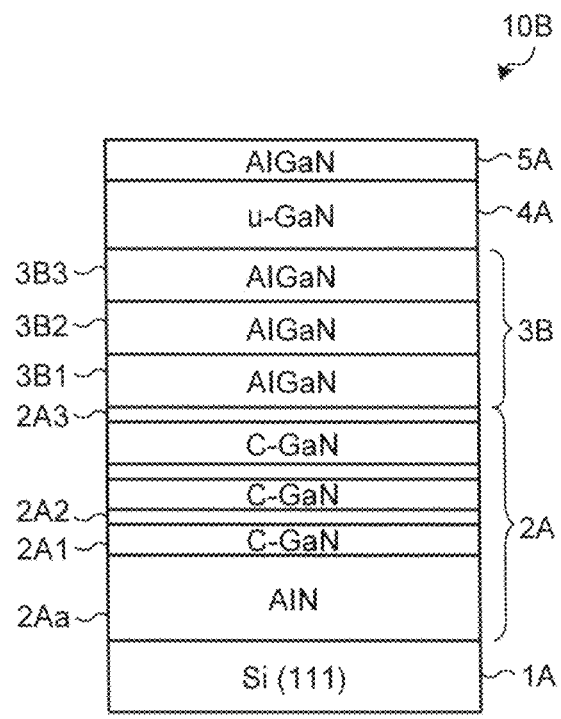
FIG. 4 is a schematic view of a semiconductor multi-layer substrate according to an embodiment 3.

FIG. 4 is a schematic view of a semiconductor multi-layer substrate according to an embodiment 3. A semiconductor multi-layer substrate 10B has a structure in which the second warp control layer 3A of the semiconductor multi-layer substrate 10A of FIG. 3A is replaced with a second warp control layer 3B.

The second warp control layer 3B is of a structure that AlGaN layers 3B1, 3B2, and 3B3 of which Al compositions decrease toward a direction to surfaces within a range of 25% to 100% of Al compositions are layered. The Al composition is constant in each of the AlGaN layers 3B1, 3B2, and 3B3. Each of the Al composition may decrease toward a surface direction. In order to prevent an electric field barrier layer in the structure from being produced due to an unintended carrier (two-dimensional electron gas) produced by a piezo polarization and a spontaneous polarization, $Al_uGa_{1-u}N$ having a thickness of 1 nm to 10 nm and $Al_vGa_{1-v}N$ (v<u) having a thickness of 4 nm to 25 nm may be layered repeatedly a plurality of times so that an average Al composition of the superlattice structure corresponds to those of the AlGaN layers 3B1, 3B2, and 3B3. Since a band gap decreases toward a surface, it is possible to restrain an unintended carrier (two-dimensional electron gas) from being produced in the second warp control layer 3B. An effect of reducing a threading dislocation density in the active layer 4A is obtained. A leakage current flowing in a surface direction can be reduced furthermore by restraining a two-dimensional electron gas from being produced in the second warp control layer.

Figure 5:
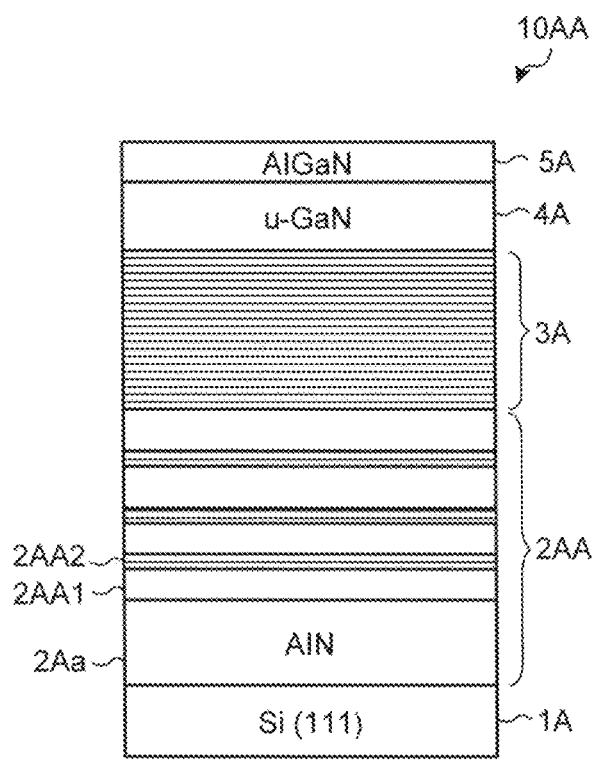
FIG. 5 is a schematic view of a semiconductor multi-layer substrate according to an embodiment 4.

FIG. 5 is a schematic view of a semiconductor multi-layer substrate according to an embodiment 4. A semiconductor multi-layer substrate 10AA has a structure in which the first warp control layer 2A of the semiconductor multi-layer substrate 10A in FIG. 3A is replaced with a first warp control layer 2AA.

The first warp control layer 2AA has a structure that an $Al_tGa_{1-t}N$ layer 2AA1 (t<0.3) having a thickness of 100 nm to 1000 nm and an AlGaN layer 2AA2 having a thickness of 20 nm to 500 nm are layered repeatedly a plurality of times on the AlN layer 2Aa having a thickness of 20 nm to 200 nm. An $Al_rGa_{1-r}N$ layer which has a thin thickness of 1 nm to 10 nm to a degree that a quantum size effect is not produced similarly to FIG. 3D and a $Al_sGa_{1-s}N$ layer (r>s) which has a thickness of 4 nm to 25 nm to a degree that a quantum size effect is not produced are layered repeatedly in a plurality of times in the AlGaN layer 2AA2. In order to restrain an unintended carrier from being produced by a piezo polarization and a spontaneous polarization at an interface between the $Al_rGa_{1-r}N$ layer and the $Al_sGa_{1-s}N$ layer and a leakage current from flowing in a direction of the substrate 1A, a first AlGaN graded layer, of which Al composition increases stepwise or continuously from s to r, may be provided between the $Al_rGa_{1-r}N$ layer and the $Al_sGa_{1-s}N$ layer, and a second AlGaN graded layer, of which Al composition decreases stepwise or continuously from s to r, may be provided between the $Al_sGa_{1-s}N$ layer and the $Al_rGa_{1-r}N$ layer similarly to FIG. 3E. The first warp control layer 3A is not limited to the above-described structure and may be of a structure that, an $Al_tGa_{1-t}N$ layers 2AA1 (t<0.3) which has a thickness of 100 nm to 1000 nm and an AlGaN layer which thickness is 20 nm to 500 nm are layered repeatedly a plurality of times on the AlN layer 2Aa having a thickness of 20 nm to 200 nm. In the AlGaN layer, a seventh AlGaN graded layer which has a thickness of 1 nm to 25 nm and a eighth AlGaN graded layer which thickness is 1 nm to 25 nm are layered repeatedly a plurality of times similarly to FIG. 3F. An Al composition of the seventh AlGaN graded layer increases stepwise or continuously from s to r, and an Al composition of the eighth AlGaN graded layer decreases from r to s stepwise or continuously.

The semiconductor multi-layer substrate 10AA is provided with the second warp control layer 3A of which amount of warp increasing per a unit thickness is smaller than that of the first warp control layer 2AA. As a result of that, it is possible to increase the thickness of the active layer 4A (for example, equal to or larger than 0.4 μm), thereby restraining a current collapse.

It is preferable to restrain a current leakage and a current collapse in a state that a withstand voltage is maintained if thicknesses of the active layer, second warp control layer, and the first warp control layer relative to total thickness of the multi-layer semiconductor layer (growth layer) of each of the above-described semiconductor multi-layer substrates are within a range of ±0.4 μm relative to thicknesses of which ratio is 1:2:2.

If all the thicknesses of the active layer, the second warp control layer, and the first warp control layer are increased within a range of ±0.4 μm relative to the thicknesses of which ratio is 1:2:2, the withstand voltage can be increased without increasing a crack density.

A semiconductor multi-layer substrate was produced according to an example schematically illustrated in FIG. 6. A semiconductor multi-layer substrate 10C has a structure in which the active layer 4A and the semiconductor layer 5A of the semiconductor multi-layer substrate 10A in FIG. 3A are replaced with an active layer 4C and a semiconductor layer 5C, respectively.

The semiconductor layer 5C is made of $Al_{0.25}Ga_{0.75}N$. The active layer 4C is constituted of a C—GaN layer 4C1 and a u-GaN layer 4C2. A carbon concentration of the active layer 4C is $1\times10^{16}$ $cm^{-3}$ to $5\times10^{19}$ $cm^{-3}$, and the active layer 4C has a structure that the carbon concentration decreases where it is closer to a surface. The u-GaN layer 4C2 is an area of which carbon concentration is equal to or smaller than $1\times10^{17}$ $cm^{-3}$, and of which thickness is equal to or larger than 0.1 μm. It is hereby possible to reduce a deep level formed by carbon by making the active layer 4C2 close to a channel be a u-GaN layer, and thereby possible to restrain a current collapse furthermore. In addition, it is possible to increase resistance by making the active layer 4C1, which is distant from a channel, be a C—GaN layer, and thereby possible to reduce a leakage current.

The thickness of the first warp control layer 2A is 2 μm+40 nm, and the thickness of the second warp control layer 3A is 2 μm. The sum of the thickness of the C—GaN layer 4C1 and the thickness of the u-GaN layer 4C2 is 1.2 μm. The total thickness of the multi-layer semiconductor layer (growth layer) is 5.3 μm. The substrate 1A is four inches in diameter and 1 mm in thickness.

In the present example, the active layer was grown at 1000° C. to 1080° C. for reducing the carbon concentration of the active layer to the above-described desirable carbon concentration by metal organic chemical vapor deposition method. The first warp control layer and the second warp control layer were grown at 900° C. to 1000° C. for obtaining the above-described desirable carbon concentrations.

Figure 7A:
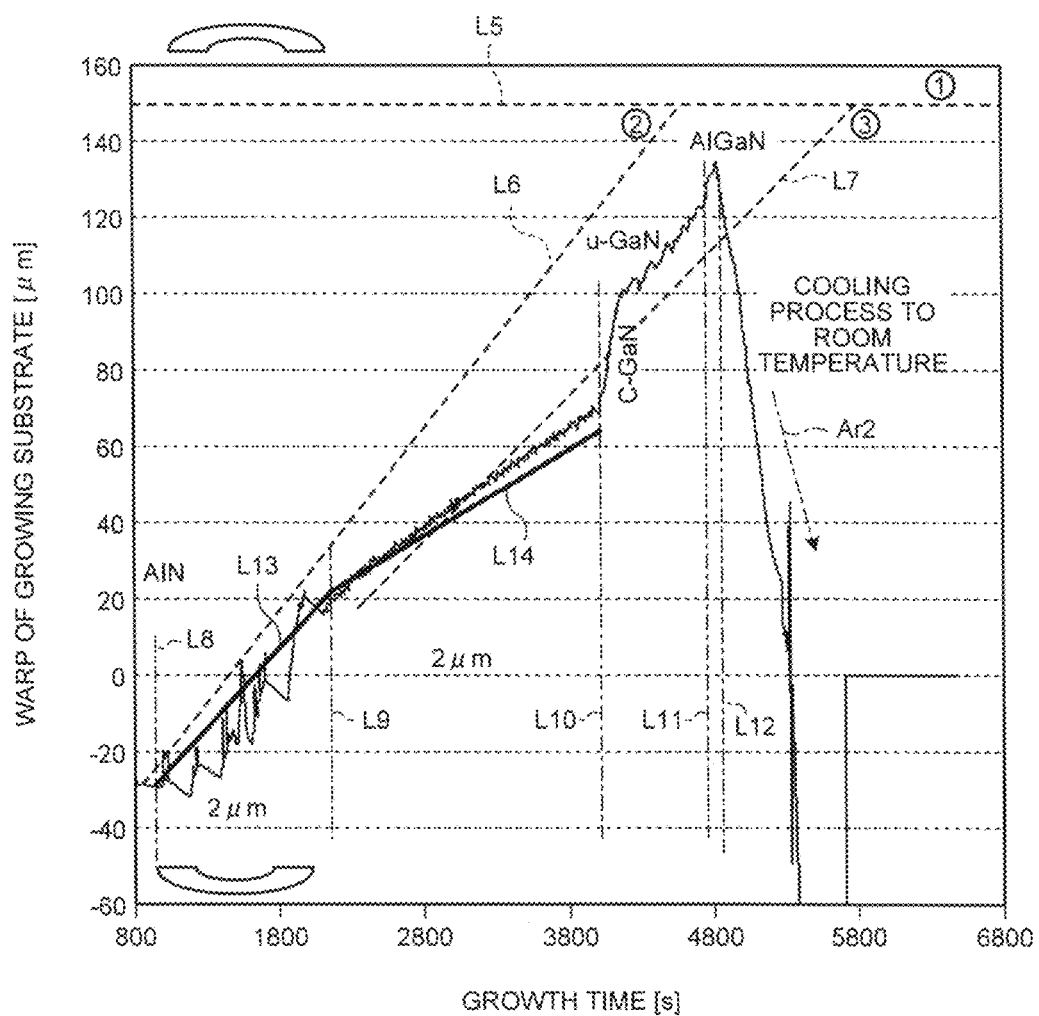
FIG. 7A is a drawing illustrating a relationship between a growth time and a warp of a semiconductor multi-layer substrate in a case using a four-inch Si substrate.

FIG. 7A is a drawing showing a relationship between a growth time and a warp of the semiconductor multi-layer substrate. A line L8 indicates an interface between the AlN layer 2Aa and other portion in the first warp control layer 2A. A line L9 indicates an interface between the first warp control layer 2A and the second warp control layer 3A. A line L10 indicates an interface between the second warp control layer 3A and the active layer 4C. A line L11 indicates an interface between the active layer 4C and the semiconductor layer 5C. Lines 13 and 14 indicate inclinations of growth time-warp for the first warp control layer 2A and the second warp control layer 3A. An amount of increase in a warp per a unit film thickness (growth time) of the second warp control layer 3A is smaller than that of the first warp control layer 2A.

In the example shown in FIG. 7A, a cooling step to a room temperature was conducted as indicated by an arrow Ar2 after growing the growth layer, and the warp was restrained to approximately 0 μm. In contrast to a case where a thickness which was equivalent to that of the first warp control layer 2A was conducted by a superlattice structure of a buffer layer, it was possible to reduce the growth time by 30% and save material, i.e., trimethyl gallium and ammonia by 30%, thereby it was effective for reducing production cost.

Figure 7B:
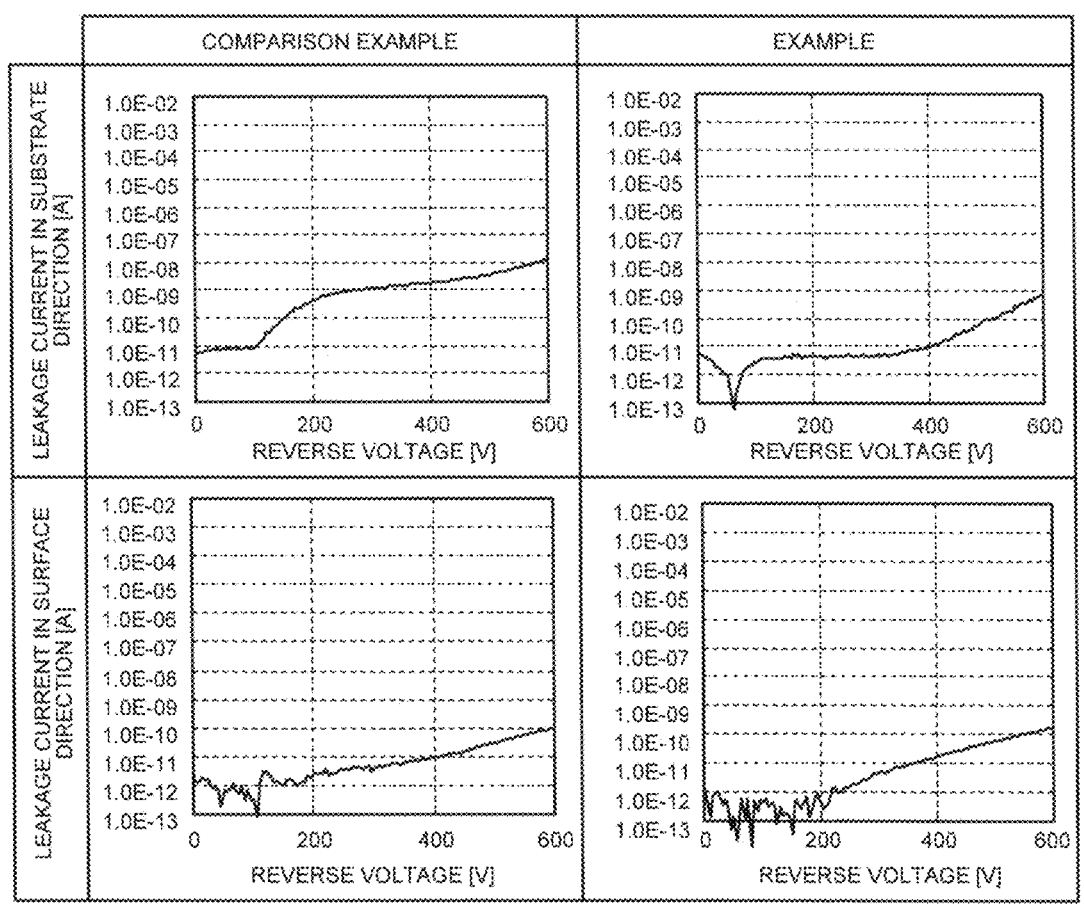
FIG. 7B is a drawing illustrating leakage currents in a substrate direction and leakage currents in a surface direction of the example of FIG. 6 and a simple superlattice buffer layer.

FIG. 7B is a drawing indicating leakage currents in a substrate direction and leakage currents in a surface direction in the example of FIG. 6 and a comparison example (simple superlattice buffer layer). The inventors produced a semiconductor multi-layer substrate as a comparison example, in which a thickness of the second warp control layer 3A in place of the first warp control layer 2A was 4 μm and a few crack exists, so as to be the same thickness as that of the example of FIG. 6, and compared the leakage currents in the substrate direction and the surface direction in a crack-free portion. As a result, as indicated in FIG. 7B, although the leakage currents in the surface direction were similar, there was an effect that the leakage currents in the substrate direction decreased by one digit in the present example. In a case of the comparison example, since it is difficult to dope the AlGaN layer or the AlN layer of which Al composition is high in degree with carbon, residual carriers in the buffer layer increase. On the other hand, in the present example, since a highly resistive C—GaN layer occupies the first warp control layer to a large degree, there is an effect that the residual carriers are extremely low and a leakage current in the substrate direction is restrained.

When the semiconductor multi-layer substrate reaches a room temperature after a cooling step to the room temperature as shown in FIG. 7A, it is preferable that the amount of warp of the semiconductor multi-layer substrate is within ±50 μm which is calculated based on a radius of curvature in case a diameter of the substrate is four inches and a thickness of the substrate is 1 mm.

Herein as a comparison example, a semiconductor multi-layer substrate, having 5.2 μm of total thickness was produced by increasing the thickness of the AlN layer 2Aa of the first warp control layer 2A and decreasing the thickness of the C—GaN layer 2A1 to a degree that is equivalent to the increased thickness of the AlN layer 2Aa so that an absolute value of the warp amount at a room temperature is larger than 50 μm calculated based on the radius of curvature in a case where the substrate is four inches in diameter and 1 mm in thickness. After that, a time-depending change in a state of its surface was observed.

Figure 8:
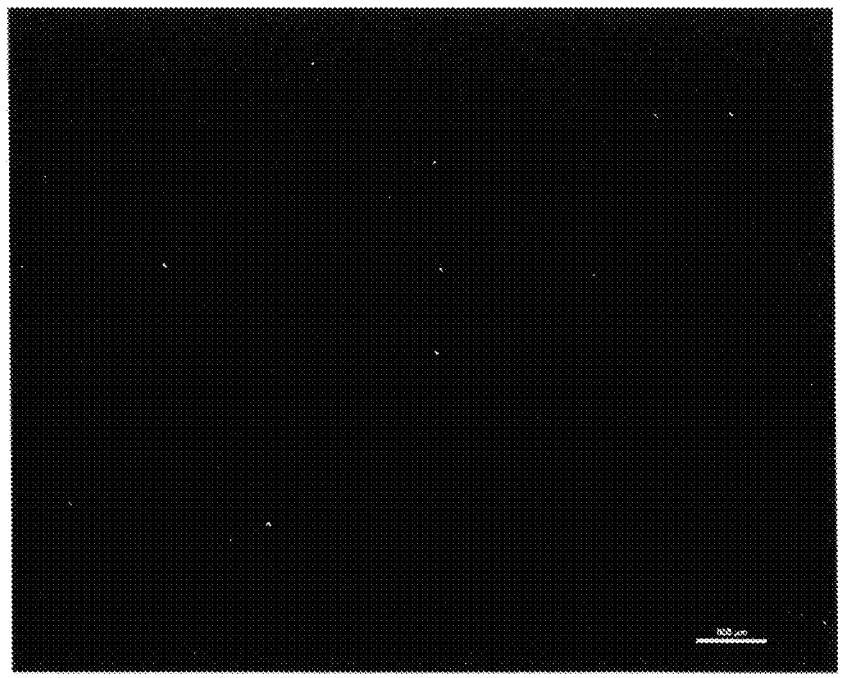
FIG. 8 is a drawing showing a photograph of a surface of a semiconductor multi-layer substrate of a comparison example taken immediately after a temperature falling down to a room temperature after growing a multi-layer semiconductor layer.
Figure 9:
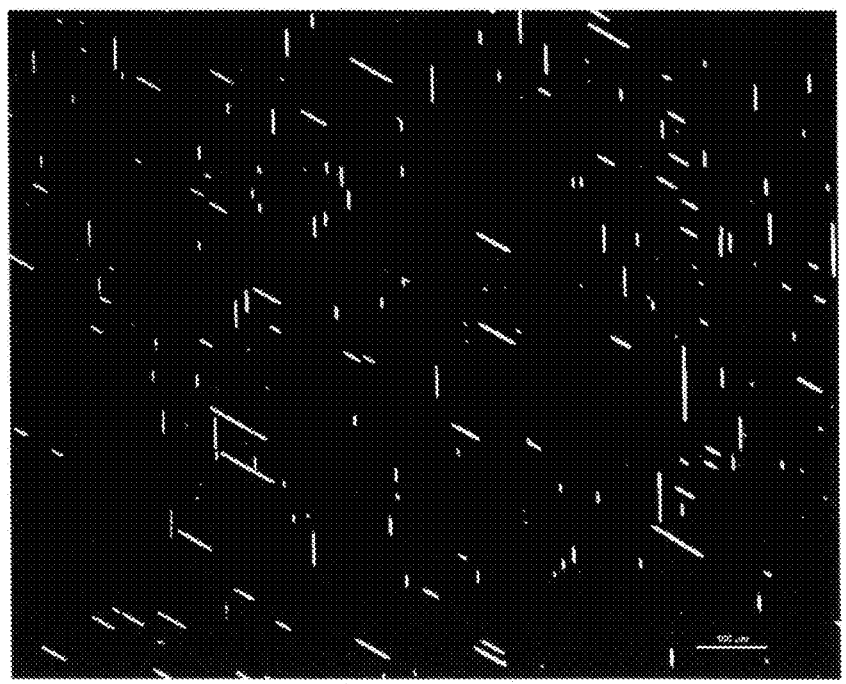
FIG. 9 is a drawing showing a photograph of a surface of the semiconductor multi-layer substrate of the comparison example taken two months after FIG. 8 was taken.

FIG. 8 is a drawing showing a photograph of a surface of a semiconductor multi-layer substrate of a comparison example taken immediately after a temperature falling down to a room temperature after growing the multi-layer semiconductor layer. FIG. 9 is a drawing showing a photograph of a surface of the semiconductor multi-layer substrate of the comparison example taken two months after FIG. 8 was taken. White lines shown in the lower right in FIGS. 8 and 9 are scales indicating 100 μm. As shown in FIG. 8, although the surface of the semiconductor multi-layer substrate of the comparison example immediately after being cooled down to a room temperature looked fine, many cracks were produced after two months as indicated by the white lines. On the other hand, when observing a time-depending change in a state of the surface of the semiconductor multi-layer substrate of the example, the state of the surface showed no change from the state observed immediately after being cooled down to the room temperature even if it was two month after, and a crack like that of the comparison example was not observed.

Although the diameter of the substrate is four inches in the above-described example and the comparison example, in a case where the diameter of the substrate is of another size, it is preferable that the warp amount of the semiconductor multi-layer substrate at a room temperature after the multi-layer semiconductor layer is grown is of a value that is equivalent to the warp amount within ±50 μm calculated based on the radius of curvature in a case where the diameter of the substrate is four inches and the thickness thereof is 1 mm.

Next, the inventors confirmed that the value of a warp which is a stress limit and is shown by the line L5 in FIGS. 2 and 7A fluctuates depending on the oxygen concentration of an Si substrate. Herein the oxygen concentration is provided in American Society for Testing and Materials (ASTM) F121-79.

The inventors produced a semiconductor multi-layer substrate under a condition that is the same as that of the above-described example except that the oxygen concentration of the substrate is varied. During the production, the maximum value of a warp of the substrate, on which a multi-layer semiconductor layer was being grown, was measured.

Figure 10:
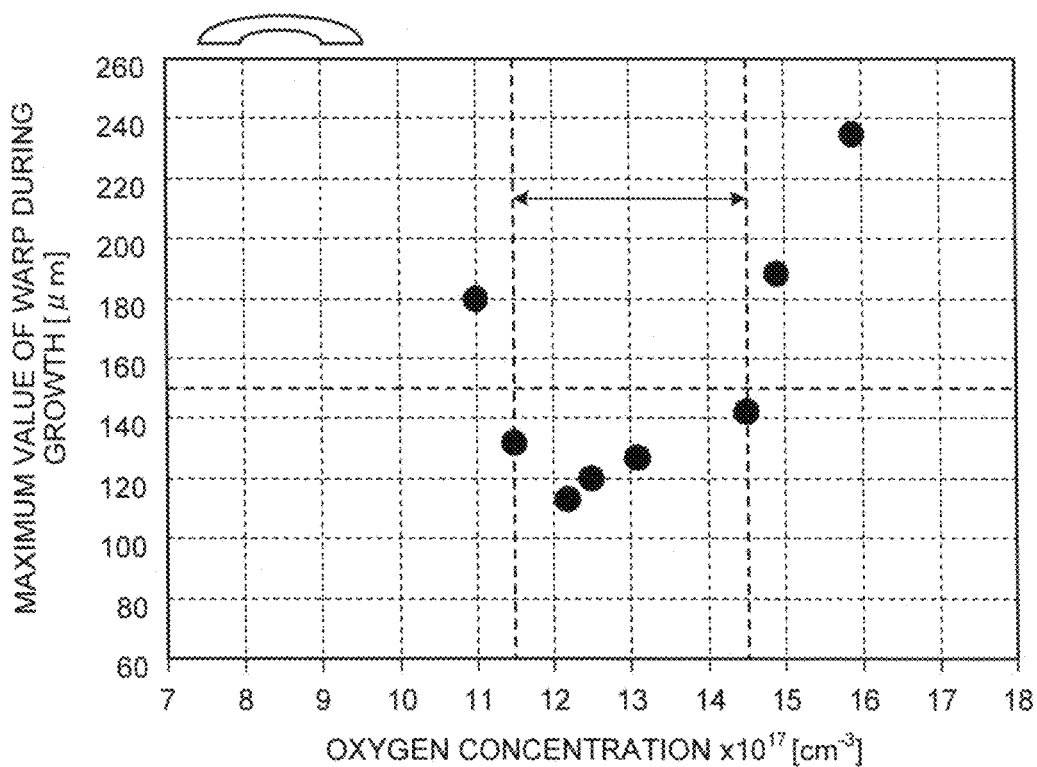
FIG. 10 is a drawing showing a relationship between an oxygen concentration in a substrate and a maximum value of a warp during growing a multi-layer semiconductor layer.

FIG. 10 is a drawing showing a relationship between an oxygen concentration in the substrate and a maximum value of a warp during growing the multi-layer semiconductor layer. As shown in FIG. 10, although the maximum value of the warp was equal to or smaller than 150 μm in a case where the oxygen concentration in the substrate is within a range of $11.5 \times 10^{17}$ cm$^{-3}$ to $14.5 \times 10^{17}$ cm$^{-3}$, the maximum value of the warp increases and exceeds 150 μm in a case where the oxygen concentration exceeds the range, thus the warp amount increased drastically.

Figure 11:
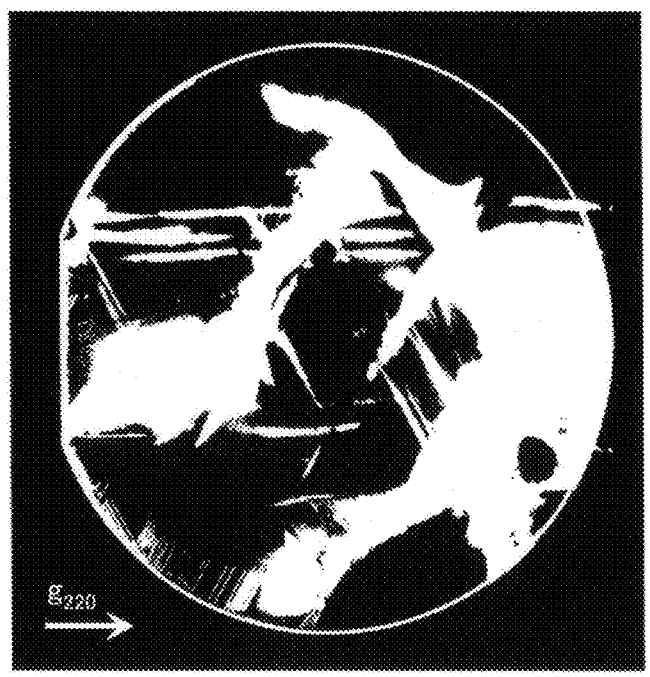
FIG. 11 is a drawing showing an image of an X-ray topography of a semiconductor multi-layer substrate obtained under a diffraction condition g220 of an Si (111) substrate of which oxygen concentration is $11.0 \times 10^{17}$ cm$^{-3}$ in the semiconductor multi-layer substrate.
Figure 12:
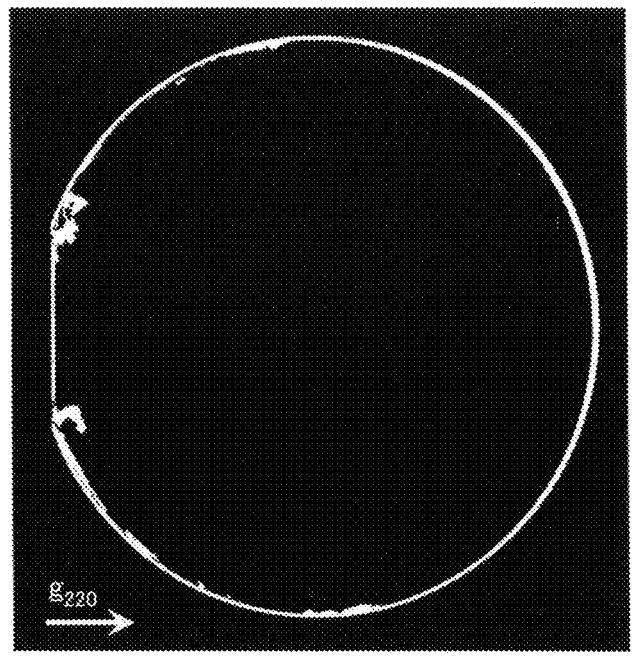
FIG. 12 is a drawing showing an image of an X-ray topography of a semiconductor multi-layer substrate obtained under a diffraction condition g220 of an Si (111) substrate of which oxygen concentration is $12.2 \times 10^{17}$ cm$^{-3}$ in the semiconductor multi-layer substrate.
Figure 13:
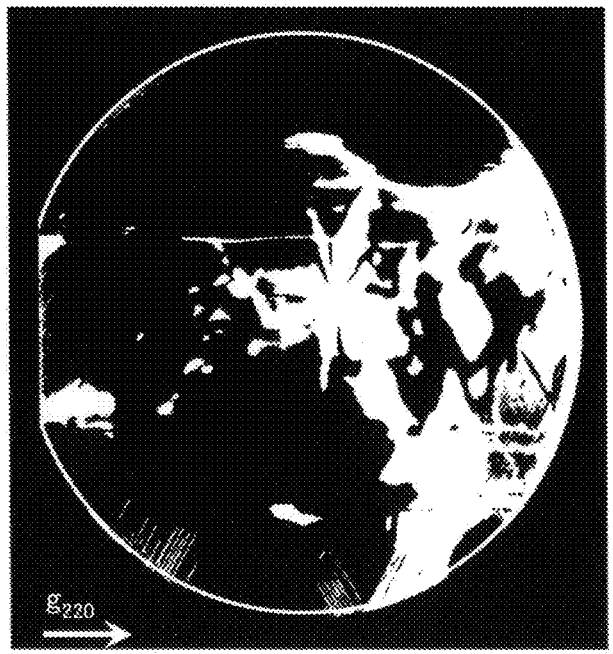
FIG. 13 is a drawing showing an image of an X-ray topography of a semiconductor multi-layer substrate obtained under a diffraction condition g220 of an Si (111) substrate of which oxygen concentration is $15.0 \times 10^{17}$ cm$^{-3}$ in the semiconductor multi-layer substrate.

FIG. 11 is a drawing showing an image of an X-ray topography of a semiconductor multi-layer substrate in a case where an oxygen concentration is $11.0 \times 10^{17}$ cm$^{-3}$. FIG. 12 is a drawing showing an image of an X-ray topography of a semiconductor multi-layer substrate in a case where an oxygen concentration is $12.2 \times 10^{17}$ cm$^{-3}$. FIG. 13 is a drawing showing an image of an X-ray topography of a semiconductor multi-layer substrate in a case where an oxygen concentration is $15.0 \times 10^{17}$ cm$^{-3}$. White portions in FIGS. 11 to 13 indicate an area of a slip line produced in the substrate. As shown in FIG. 11, in a case where the oxygen concentration was smaller than $11.5 \times 10^{17}$ cm$^{-3}$, a slip line was in the whole Si substrate. It is considered that, in a case where the oxygen concentration is low, a slip dislocation in the substrate to cause a plastic deformation of the substrate, and thereby the maximum value of a warp of the substrate exceeds 150 μm which is the maximum value of the warp determined by physical properties of silicone. On the other hand, in a case where the oxygen concentration is larger than $14.5 \times 10^{17}$ cm$^{-3}$ as shown in FIG. 13, it is considered that an oxygen and a silicon form a cluster defect by oxygen segregation to hereby decrease an yield stress of the substrate. It is considered that such decrease in yield stress caused a plastic deformation of the substrate, and thus the maximum value of warp exceeded 150 μm.

The warp of the semiconductor multi-layer substrate shown in FIGS. 11 and 13 at a room temperature was approximately the same as the maximum value of the warp amount during being grown since the Si substrate was subject to plastic deformation. In contrast, the warp amount of the semiconductor multi-layer substrate shown in FIG. 12 was within ±50 μm at a room temperature since the Si substrate was subject to elastic deformation. There was not a slip line produced on the substrate except an area between an outer periphery and a 20 mm width therefrom of the substrate.

Since, in a case where the oxygen concentration in the substrate is within a range of $11.5 \times 10^{17}$ cm$^{-3}$ to $14.5 \times 10^{17}$ cm$^{-3}$, a plastic deformation of the substrate does not occur and the substrate is subject to elastic deformation, it is considered that the maximum value of warp during growth does not exceed a value that is equivalent to a warp amount of 150 μm calculated based on the radius of curvature in a case where the diameter of the substrate is four inches and the thickness is 1 mm. As described above, in a case where a plastic deformation of the substrate does not occur, it is possible to control the warp of the semiconductor multi-layer substrate cooled down to a room temperature within a desirable range of warp amount. This range of the oxygen concentration in the substrate is preferable for a semiconductor multi-layer substrate having a thickness of equal to or larger than 4 μm. It is preferable that a difference of oxygen concentration in the substrate between a center portion and an outer periphery portion of the substrate is within 5%.

A relationship between the thickness of the substrate and the radius of curvature of the semiconductor multi-layer substrate based on a bimetal simple approximation is represented by a formula (1) as follows. That is, if the substrate increases in thickness, the radius of curvature increases by a square of the thickness. The radius of curvature and the warp amount follow a formula (2) below. That is, the warp amount increases if the diameter of the substrate increases and the radius of curvature remains the same. An yield stress of the substrate relative to the thickness and the diameter of the substrate can be inferred from the present example according to the formulae (1) and (2).

$$R = 1/\{6(\alpha sub - \alpha epi)\Delta T\} \cdot (Esub/Eepi) \cdot (tsub^2/tepi) \quad (1)$$

$$h = R[1 - \cos\{d/(2R)\}] \quad (2)$$

R indicates a radius of curvature;
h indicates a warp amount of a semiconductor multi-layer substrate;
αsub indicates a coefficient of thermal expansion of a substrate;
αepi indicates a coefficient of thermal expansion of a layered growth layer;
ΔT indicates a difference between a room temperature and a layer-growing temperature;
tsub indicates a thickness of the substrate;
tepi indicates a thickness of the layered growth layer;
Esub indicates a Young's modulus of the substrate;
Eepi indicates a Young's modulus of the layered growth layer; and
d indicates a diameter of the substrate.

Figure 14:
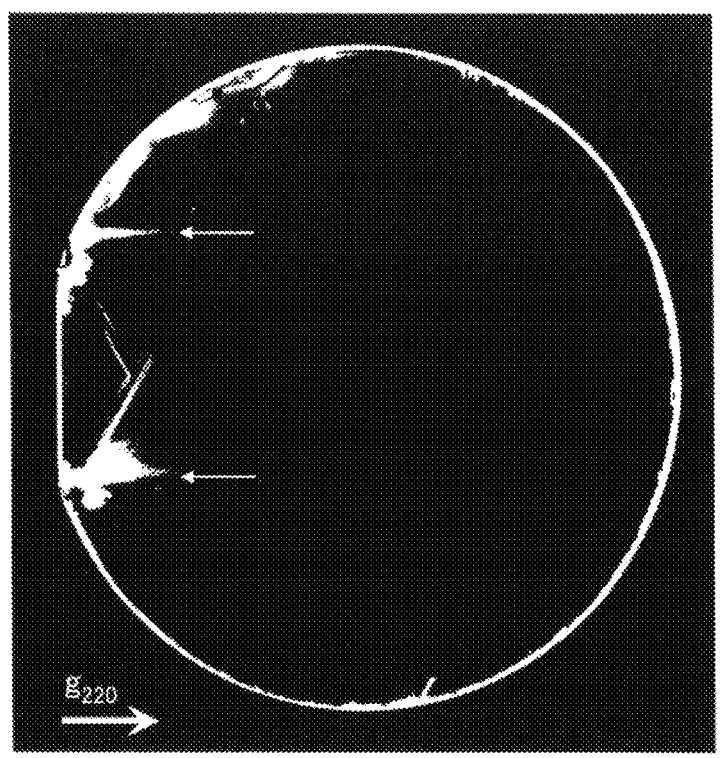
FIG. 14 is a drawing showing an image of an X-ray topography of a semiconductor multi-layer substrate obtained under a diffraction condition g220 of an Si (111) substrate of which oxygen concentration is $12.5 \times 10^{17}$ cm$^{-3}$ in the semiconductor multi-layer substrate.

FIG. 14 is a drawing showing an image of an X-ray topography of a semiconductor multi-layer substrate in a case where an oxygen concentration is $12.5 \times 10^{17}$ cm$^{-3}$. A white portion in FIG. 14 shows an area in which a slip line is produced. An orientation flat is formed at a left side of FIG. 14. A slip line is formed at a portion indicated by a white arrow in FIG. 14. As described above, such a slip line is not preferable for controlling a warp of the semiconductor multi-layer substrate. However, in a case of a substrate having a diameter of four inches, a warp can be controlled if a slip line is produced in an area between an outer periphery and a 20 mm width therefrom of the substrate and unless there is a slip line produced on the substrate except the area between the outer periphery and the 20 mm width therefrom of the substrate. As shown in FIG. 14, since a slip line tends to be produced at a portion of the orientation flat, it is preferable to use a substrate not having an orientation flat for controlling a warp of the semiconductor multi-layer substrate. In a case of a substrate not having an orientation flat, for example, a notch or a marker can be formed to specify its crystal direction.

A field effect transistor or a Schottky barrier diode can be produced by forming a Schottky electrode, an ohmic electrode, or an insulating film appropriately on the semiconductor layer of the semiconductor multi-layer substrate of the above-described embodiment.

Figure 15:
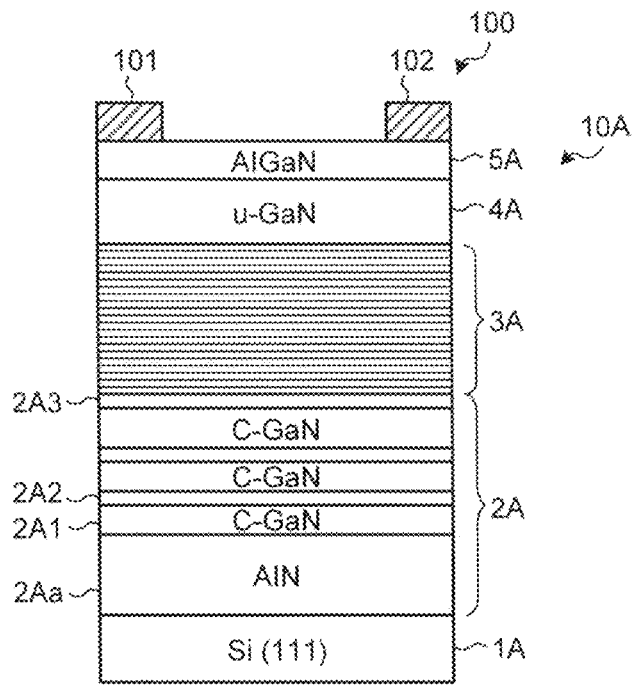
FIG. 15 is a schematic view of a diode according to an embodiment 5.

FIG. 15 is a schematic view of a diode according to an embodiment 5 of the present invention. A diode 100 is a Schottky barrier diode having a configuration in which an anode electrode 101 making a Schottky contact with the semiconductor layer 5A and a cathode electrode 102 making an ohmic contact with the semiconductor layer 5A are formed on the semiconductor layer 5A of the semiconductor multi-layer substrate 10A according to the embodiment 2 shown in FIG. 3A. Since the diode 100 is provided with the semiconductor multi-layer substrate 10A according to the embodiment 2, the diode 100, restraining a current leakage and a current collapse therein and thus being capable of having equal to or larger than 600V of withstand voltage, is of low cost.

Figure 16:
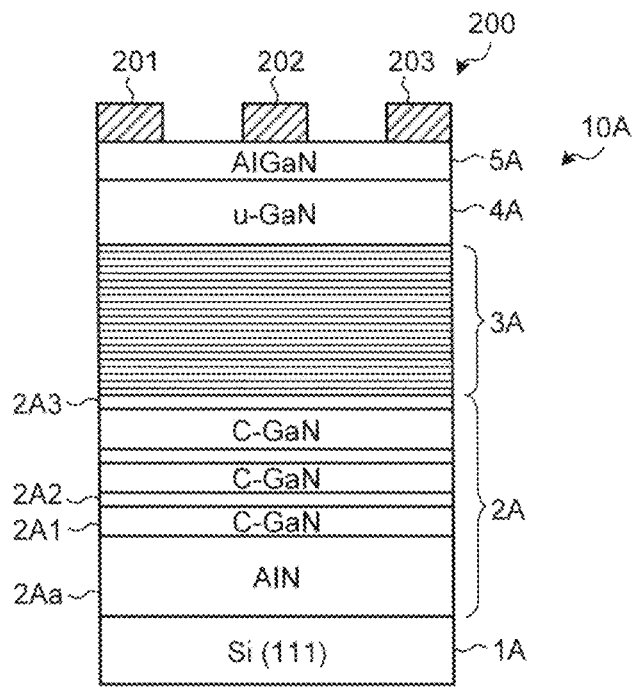
FIG. 16 is a schematic view of a field effect transistor according to an embodiment 6.

FIG. 16 is a schematic view of a field effect transistor according to an embodiment 6 of the present invention. A field effect transistor 200 is a high electron mobility transistor (HEMT) having a configuration in which a source electrode 201 and a drain electrode 203 making ohmic contacts with the semiconductor layer 5A and a gate electrode 202 making a Schottky contact with the semiconductor layer 5A are formed on the semiconductor layer 5A of the semiconductor multi-layer substrate 10A according to the embodiment 2 shown in FIG. 3A. Since the field effect transistor 200 is also provided with the semiconductor multi-layer substrate 10A according to the embodiment 2, the field effect transistor 200, restraining a current leakage and a current collapse therein and thus being capable of having equal to or larger than 600V of withstand voltage, is of low cost.

An MOS-type field effect transistor may be configured based on the configuration of the field effect transistor 200, i.e. by forming an opening portion on the semiconductor layer 5A of the semiconductor multi-layer substrate 10A and connecting the gate electrode 202 with the active layer 4A via a gate insulating film at the opening portion.

In the first warp control layer, an $Al_xGa_{1-x}N$ layer having a thickness to a degree that a quantum size effect is not obtained and an $Al_yGa_{1-y}N$ layer (x>y) having a thickness to a degree that a quantum size effect is not obtained may be layered repeatedly a plurality of times.

In the second warp control layer, AlN and GaN may be layered a plurality of times repeatedly. For example, the thickness of AlN is 5 nm and the thickness of GaN is 20 nm. An average Al composition is hereby 20%. For obtaining 20% of average Al composition, the thickness of AlN may be 1 nm and the thickness of GaN may be 4 nm.

As described above, the semiconductor multi-layer substrate, the semiconductor device, and the manufacturing method for making the same according to the present invention are preferable for use in a semiconductor multi-layer substrate and a semiconductor device mainly made of a nitride semiconductor.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A semiconductor multi-layer substrate comprising:
a substrate made of Si; and
a multi-layer semiconductor layer, wherein
the multi-layer semiconductor layer includes:
   an active layer made of a nitride semiconductor;
   a first warp control layer being formed between the substrate and the active layer and giving a first predetermined warp to the substrate; and
   a second warp control layer made of a nitride semiconductor and giving a second predetermined warp to the substrate,
the second predetermined warp given to the substrate is less than the first predetermined warp given to the substrate,
a total thickness of the multi-layer semiconductor layer is equal to or larger than 4 µm, and
the first warp control layer has a structure in which an $Al_xGa_{1-x}N$ layer which is thick to a degree that a quantum size effect is not produced and an $Al_yGa_{1-y}N$ layer (x>y) which is thick to a degree that a quantum size effect is not produced are layered repeatedly a plurality of times, and an AlGaN layer is provided at interfaces between each of the $Al_xGa_{1-x}N$ layers and each of the $Al_yGa_{1-y}N$ layers, and Al compositions of the AlGaN layers vary gradedly and stepwise or continuously between x and y.

2. The semiconductor multi-layer substrate according to claim 1, wherein a ratio of thicknesses of the active layer, the second warp control layer, and the first warp control layer relative to a total thickness of the multi-layer semiconductor layer of the semiconductor multi-layer substrate is 1:2:2 or the thicknesses are within a range of ±0.4 µm from the ratio.

3. The semiconductor multi-layer substrate according to claim 1, wherein a crack is prevented from being produced in an area not including a 10 mm width of area from an outer periphery portion of the semiconductor multi-layer substrate.

4. The semiconductor multi-layer substrate according to claim 1, wherein the first warp control layer has a structure in which an AlN layer of which thickness is 20 nm to 100 nm and a GaN layer of which thickness is 100 nm to 1000 nm are layered repeatedly a plurality of times, and an AlGaN layer is provided at interfaces between each the AlN layers and each the GaN layers, and Al compositions of the AlGaN layers varies gradedly and stepwise or continuously.

5. The semiconductor multi-layer substrate according to claim 1, wherein
the second warp control layer is made by layering a $Al_uGa_{1-u}N$ layer of which thickness is 1 nm to 10 nm and an $Al_vGa_{1-v}N$ layer (v<u) of which thickness is 4 nm to 25 nm,
the $Al_uGa_{1-u}N$ layer is thin to a degree that a quantum size effect is produced, and
the $Al_yGa_{1-y}N$ layer is thin to a degree that a film quantum size effect is produced repeatedly a plurality of times.

6. The semiconductor multi-layer substrate according to claim 1, wherein
the second warp control layer is made by layering an $Al_uGa_{1-u}N$ layer of which thickness is 1 nm to 10 nm and an $Al_vGa_{1-v}N$ layer (v<u) of which thickness is 4 nm to 25 nm,
the $Al_uGa_{1-u}N$ layer is thin to a degree that a quantum size effect is produced,
the $Al_vGa_{1-v}N$ layer is thin to a degree that a film quantum size effect is produced repeatedly a plurality of times, and a layer, of which Al composition vary between v and u gradedly and stepwise or continuously, are provided at interfaces between each of the $Al_uGa_{1-u}N$ layers and each of the $Al_vGa_{1-v}N$ layers.

7. The semiconductor multi-layer substrate according to claim 1, wherein the second warp control layer has a structure in which an AlGaN graded layer of which Al composition increases from v to u stepwise or continuously and of which thickness is 1 nm to 25 nm and an AlGaN graded layer of which Al composition decreases from u to v stepwise or continuously and of which thickness is 1 nm to 25 nm are layered repeatedly a plurality of times.

8. The semiconductor multi-layer substrate according to claim 1, wherein the second warp control layer has a structure in which AlGaN are layered so that Al compositions decrease in a direction toward a surface within a range of 25% to 100% of the Al composition.

9. The semiconductor multi-layer substrate according to claim 1, wherein the active layer is made of GaN.

10. The semiconductor multi-layer substrate according to claim 9, wherein a carbon concentration of the active layer is $1 \times 10^{16}$ cm$^{-3}$ to $5 \times 10^{19}$ cm$^{-3}$, and the carbon concentration decreases closer to a surface.

11. The semiconductor multi-layer substrate according to claim 9, wherein a thickness of an area of the active layer in which the carbon concentration is equal to or smaller than $1 \times 10^{17}$ cm$^{-3}$ is equal to or larger than 100 nm.

12. The semiconductor multi-layer substrate according to claim 1, wherein an average carbon concentrations of the first warp control layer and the second warp control layer are 0.5 to $5 \times 10^{19}$ cm$^{-3}$ respectively.

13. The semiconductor multi-layer substrate according to claim 1, further comprising a semiconductor layer or an insulating film being grown on the active layer and having a band gap which is larger than a band gap of the active layer, wherein the active layer is caused to produce a two-dimensional electron gas.

14. The semiconductor multi-layer substrate according to claim 1, wherein a thickness of the substrate at a time of crystal growth is 525 µm to 1200 µm.

15. The semiconductor multi-layer substrate according to claim 1, wherein a slip line is not produced on the substrate within an area between an outer periphery portion and a 20 mm width therefrom of the substrate.

16. The semiconductor multi-layer substrate according to claim 1, wherein an oxygen concentration in the substrate is $11.5 \times 10^{17}$ cm$^{-3}$ to $14.5 \times 10^{17}$ cm$^{-3}$.

17. The semiconductor multi-layer substrate according to claim 16, wherein a difference of oxygen concentration in the substrate between a center portion and an outer periphery portion of the substrate is within 5%.

18. The semiconductor multi-layer substrate according to claim 1, wherein the substrate does not have an orientation flat.

19. A semiconductor multi-layer substrate comprising:
    a substrate made of Si; and
    a multi-layer semiconductor layer, wherein
    the multi-layer semiconductor layer includes:
        a first warp control layer being made of a nitride semiconductor grown on the substrate and imparting a first predetermined warp to the substrate;
        a second warp control layer made of a nitride semiconductor, grown on the first warp control layer, and imparting a second predetermined warp to the substrate; and
        an active layer made of a nitride semiconductor grown on the second warp control layer, the second predetermined warp imparted to the substrate is less than the first predetermined warp imparted to the substrate,
a total thickness of the multi-layer semiconductor layer is equal to or larger than 4 µm, and
the first warp control layer has a structure in which an $Al_xGa_{1-x}N$ layer which is thick to a degree that a quantum size effect is not produced and an $Al_yGa_{1-y}N$ layer (x>y) which is thick to a degree that a quantum size effect is not produced are layered repeatedly a plurality of times, and an AlGaN layer is provided at interfaces between each of the $Al_xGa_{1-x}N$ layers and each of the $Al_yGa_{1-y}N$ layers, and Al compositions of the AlGaN layers vary gradually and stepwise or continuously between x and y.

20. The semiconductor multi-layer substrate according to claim 19, wherein a ratio of thicknesses of the active layer, the second warp control layer, and the first warp control layer relative to a total thickness of the multi-layer semiconductor layer of the semiconductor multi-layer substrate is 1:2:2 or the thicknesses are within a range of ±0.4 µm from the ratio.

21. The semiconductor multi-layer substrate according to claim 19, wherein a crack is prevented from being produced in an area not including a 10 mm width of area from an outer periphery portion of the semiconductor multi-layer substrate.

22. The semiconductor multi-layer substrate according to claim 19, wherein the first warp control layer has a structure in which an AlN layer of which thickness is 20 nm to 100 nm and a GaN layer of which thickness is 100 nm to 1000 nm are layered repeatedly a plurality of times, and an AlGaN layer is provided at interfaces between each the AlN layers and each the GaN layers, and Al compositions of the AlGaN layers varies gradually and stepwise or continuously.

23. The semiconductor multi-layer substrate according to claim 19, wherein
    the second warp control layer is made by layering a $Al_uGa_{1-u}N$ layer of which thickness is 1 nm to 10 nm and an $Al_vGa_{1-v}N$ layer (v<u) of which thickness is 4 nm to 25 nm,
    the $Al_uGa_{1-u}N$ layer is thin to a degree that a quantum size effect is produced, and
    the $Al_vGa_{1-v}N$ layer is thin to a degree that a quantum size effect is produced repeatedly a plurality of times.

24. The semiconductor multi-layer substrate according to claim 19, wherein
    the second warp control layer is made by layering an $Al_uGa_{1-u}N$ layer of which thickness is 1 nm to 10 nm and an $Al_vGa_{1-v}N$ layer (v<u) of which thickness is 4 nm to 25 nm,
    the $Al_uGa_{1-u}N$ layer is thin to a degree that a quantum size effect is produced,
    the $Al_vGa_{1-v}N$ layer is thin to a degree that a quantum size effect is produced repeatedly a plurality of times, and
    a layer, of which Al composition vary between v and u gradually and stepwise or continuously, are provided at interfaces between each of the $Al_uGa_{1-u}N$ layers and each of the $Al_vGa_{1-v}N$ layers.

25. The semiconductor multi-layer substrate according to claim 19, wherein the second warp control layer has a structure in which an AlGaN graded layer of which Al composition increases from v to u stepwise or continuously and of which thickness is 1 nm to 25 nm and an AlGaN graded layer of which Al composition decreases from u to v stepwise or continuously and of which thickness is 1 am to 25 nm are layered repeatedly a plurality of times.

26. The semiconductor multi-layer substrate according to claim 19, wherein the second warp control layer has a structure in which AlGaN are layered so that Al compositions decrease in a direction toward a surface within a range of 25% to 100% of the Al composition.

27. The semiconductor multi-layer substrate according to claim 19, wherein the active layer is made of GaN.

28. The semiconductor multi-layer substrate according to claim 27, wherein a carbon concentration of the active layer is $1 \times 10^{16}$ cm$^{-3}$ to $5 \times 10^{19}$ cm$^{-3}$, and the carbon concentration decreases closer to a surface.

29. The semiconductor multi-layer substrate according to claim 27, wherein a thickness of an area of the active layer in which the carbon concentration is equal to or smaller than $1 \times 10^{17}$ cm$^{-3}$ is equal to or larger than 100 nm.

30. The semiconductor multi-layer substrate according to claim 19, wherein an average carbon concentrations of the first warp control layer and the second warp control layer are 0.5 to $5 \times 10^{19}$ cm$^{-3}$ respectively.

31. The semiconductor multi-layer substrate according to claim 19, further comprising a semiconductor layer or an insulating film being grown on the active layer and having a band gap which is larger than a band gap of the active layer, wherein the active layer is caused to produce a two-dimensional electron gas.

32. The semiconductor multi-layer substrate according to claim 19, wherein a thickness of the substrate at a time of crystal growth is 525 μm to 1200 μm.

33. The semiconductor multi-layer substrate according to claim 19, wherein a slip line is not produced on the substrate within an area between an outer periphery portion and a 20 mm width therefrom of the substrate.

34. The semiconductor multi-layer substrate according to claim 19, wherein an oxygen concentration in the substrate is $11.5 \times 10^{17}$ cm$^{-3}$ to $14.5 \times 10^{17}$ cm$^{-3}$.

35. The semiconductor multi-layer substrate according to claim 34, wherein a difference of oxygen concentration in the substrate between a center portion and an outer periphery portion of the substrate is within 5%.

36. The semiconductor multi-layer substrate according to claim 19, wherein the substrate does not have an orientation flat.

37. A semiconductor multi-layer substrate comprising:
a substrate made of Si; and
a multi-layer semiconductor layer, wherein
the multi-layer semiconductor layer includes:
    an active layer made of a nitride semiconductor;
    a first warp control layer being formed between the substrate and the active layer and giving a first predetermined warp to the substrate; and
    a second warp control layer made of a nitride semiconductor and giving a second predetermined warp to the substrate,
the second predetermined warp given to the substrate is less than the first predetermined warp given to the substrate,
a total thickness of the multi-layer semiconductor layer is equal to or larger than 4 μm, and
the first warp control layer has a structure in which an AlN layer of which thickness is 20 nm to 100 nm and a GaN layer of which thickness is 100 nm to 1000 nm are layered repeatedly a plurality of times.

38. A semiconductor multi-layer substrate comprising:
a substrate made of Si; and
a multi-layer semiconductor layer, wherein
the multi-layer semiconductor layer includes:
    a first warp control layer being made of a nitride semiconductor grown on the substrate and imparting a first predetermined warp to the substrate;
    a second warp control layer made of a nitride semiconductor, grown on the first warp control layer, and imparting a second predetermined warp to the substrate; and
    an active layer made of a nitride semiconductor grown on the second warp control layer,
the second predetermined warp imparted to the substrate is less than the first predetermined warp imparted to the substrate,
a total thickness of the multi-layer semiconductor layer is equal to or larger than 4 μm, and
the first warp control layer has a structure in which an AlN layer of which thickness is 20 nm to 100 nm and a GaN layer of which thickness is 100 nm to 1000 nm are layered repeatedly a plurality of times.

* * * * *